United States Patent [19]

Chao et al.

[11] Patent Number: 5,397,599
[45] Date of Patent: Mar. 14, 1995

[54] PREPARATION OF ELECTROLESS NICKEL COATING HAVING IMPROVED PROPERTIES

[75] Inventors: Herbert Shin-I Chao, Schenectady; Bradley R. Karas, Amsterdam; Donald F. Foust, Scotia, all of N.Y.

[73] Assignee: General Electric Company, Schenectady, N.Y.

[21] Appl. No.: 186,489

[22] Filed: Jan. 26, 1994

Related U.S. Application Data

[63] Continuation of Ser. No. 922,408, Jul. 31, 1992, abandoned.

[51] Int. Cl.$^6$ .............................................. B05D 1/00
[52] U.S. Cl. ........................... 427/306; 427/304; 427/305; 427/443.1
[58] Field of Search ............. 427/437, 438, 443.1, 427/304, 305, 306

[56] References Cited

U.S. PATENT DOCUMENTS

| | | | |
|---|---|---|---|
| 3,385,725 | 5/1968 | Schmeckenbecher | 427/438 |
| 3,620,804 | 11/1971 | Bauer | 427/306 |
| 4,160,049 | 7/1979 | Narcus | 427/443.1 |
| 4,217,438 | 8/1980 | Brunelle | 528/125 |
| 4,272,584 | 6/1981 | Goldberg | 427/306 |
| 4,830,889 | 5/1989 | Henry | 427/437 |
| 4,940,608 | 7/1990 | Kawagishi | 427/443.1 |
| 5,132,191 | 7/1992 | Zarnoch | 428/901 |
| 5,198,096 | 3/1993 | Foust | 427/307 |
| 5,229,169 | 7/1993 | Chao | 427/306 |

FOREIGN PATENT DOCUMENTS 230985  11/1985  Japan ................................ 427/304

Primary Examiner—Shrive Beck
Assistant Examiner—Vi Duong Dang
Attorney, Agent, or Firm—William H. Pittman

[57] ABSTRACT

Increases in surface resistivity of electroless nickel coatings on polycarbonate-containing substrates are inhibited by employing two electroless nickel plating solutions. The first solution is one which deposits a metal layer containing phosphorus, if any, in an amount up to 5% by weight and is used to deposit a layer at least 0.5 micron thick. The second solution is one which deposits a layer containing phosphorus in the amount of at least 5% and preferably at least 6% by weight. Another metal layer may be interposed between the two nickel layers.

12 Claims, No Drawings

PREPARATION OF ELECTROLESS NICKEL COATING HAVING IMPROVED PROPERTIES

This application is a continuation of application Ser. No. 07/922,408, filed Jul. 31, 1992, now abandoned.

This invention relates to the metallization of plastic surfaces, and more particularly to a metallization method useful with thermoplastic resin blends comprising principally polycarbonate.

Metallized plastics have become of interest in recent years as a replacement for metal in such articles as enclosures for electrical appliances, microwave ovens, business machines and the like. When fabricated of plastics alone, such enclosures are inadequate to shield internal parts from external radiation sources such as electromagnetic interference, particularly radio frequency interference, and static electricity, and also to prevent escape of internally generated radiation. Such sources of interference can be blocked out by providing a metal coating such as nickel on the surface of the plastic substrate, typically by electroless or electrolytic deposition. Metallization is also desirable for the formation of printed circuit boards, whereupon the entire surface or a portion thereof is metallized by additive, semi-additive or subtractive methods known in the art.

Metallization may be achieved by various processes including electrodeposition, electroless deposition, chemical vapor and physical vapor deposition. Electroless deposition of metals such as nickel is often particularly advantageous. A typical electroless deposition bath is a solution comprising a nickel salt, a reducing agent therefor such as a hypophosphite, a borohydride or hydrazine, and various additives.

A problem which arises in the metallization of plastics, especially by electroless methods, is the lack of adhesion of the metal layer to the substrate. Adhesion may be measured by a cross-hatch tape test, described in detail hereinafter.

Various methods have been developed for improving adhesion, and achieve that goal. It is sometimes found, however, that certain properties of the metal layer deteriorate under relatively severe temperature and humidity conditions even after a treatment to improve adhesion. Stability under such conditions, as demonstrated by severe accelerated aging tests, is required by many purchasers. However, exposure to high temperature and humidity for a prolonged period sometimes results in crack formation in the metal, with at least two observed effects: a decrease in adhesion to the resinous substrate, and an increase in surface resistivity which inherently means a decrease in conductivity of the metal.

Crack formation is particularly severe when electroless nickel is deposited from a solution which affords a metal layer having no phosphorus or a relatively low phosphorus content, typically less than about 5% by weight. Such solutions include those in which the reducing agent is hypophosphite, as well as those in which other reducing agents are used. Low phosphorus layers are, however, generally superior in conductivity to layers having a higher phosphorus content. The latter, on the other hand, are superior in corrosion resistance and low porosity.

The present invention is based on the discovery that crack formation is decreased by employing a combination of electroless nickel solutions, one being low and the other high in phosphorus. The metal coatings thus produced are strongly adherent, highly conductive and relatively consistent in conductivity when exposed to the above-described severe conditions. Moreover, they demonstrate substantially decreased cracking behavior under such conditions.

In one of its aspects, therefore, the invention is a method for producing a nickel coating on a resinous article comprising aromatic polycarbonate which comprises initially depositing a phosphorus-free or low phosphorus electroless nickel coating having a phosphorus content, if any, up to 5% by weight to a total thickness of at least about 0.5 micron, and subsequently depositing a high phosphorus electroless nickel coating containing phosphorus in the amount of at least 5% by weight.

The aromatic polycarbonates in the resinous articles treated in accordance with the present invention generally comprise structural units of the formula

wherein each R independently is a divalent aromatic organic radical. The R values may be different but are usually the same. Suitable R values include m-phenylene, p-phenylene, 4,4'-biphenylene, 2,2-bis(4-phenylene)propane and similar radicals such as those which correspond to the aromatic dihydroxy compounds disclosed by name or formula (generic or specific) in U.S. Pat. No. 4,217,438, the disclosure of which is incorporated by reference herein. Also included are radicals containing non-hydrocarbon moieties. These may be substituents such as chloro, nitro, alkoxy and the like, and also linking radicals such as thio, sulfoxy, sulfone, ester, amide, ether and carbonyl. Most often, however, all $R^1$ radicals are hydrocarbon radicals.

The R radicals preferably have the formula

wherein each of $A^1$ and $A^2$ is a monocyclic divalent aromatic radical and Y is a bridging radical in which one or two atoms separate $A^1$ from $A^2$. The free valence bonds in formula II are usually in the meta or para positions of $A^1$ and $A^2$ in relation to Y.

In formula II, the $A^1$ and $A^2$ values may be unsubstituted phenylene or substituted derivatives thereof, illustrative substituents (one or more) being alkyl, alkenyl, halo (especially chloro and/or bromo), nitro, alkoxy and the like. Unsubstituted phenylene radicals are preferred. Both $A^1$ and $A^2$ are preferably p-phenylene, although both may be o- or m-phenylene or one o- or m-phenylene and the other p-phenylene.

The bridging radical, Y, is one in which one or two atoms, preferably one, separate $A^1$ from $A^2$. It is most often a hydrocarbon radical and particularly a saturated radical such as methylene, cyclohexylmethylene, 2-[2.2.1]-bicycloheptylmethylene, ethylene, isopropylidene, neopentylidene, cyclohexylidene, cyclopentadecylidene, cyclododecylidene or adamantylidene, especially a gemalkylene (alkylidene) radical. Also included, however, are unsaturated radicals and radicals which contain atoms other than carbon and hydrogen; for example, 2,2-dichloroethylidene, carbonyl, phthalidylidene, oxy, thio, sulfoxy and sulfone. For reasons of availability and particular suitability for the purposes of this invention, the preferred radical of formula II is the 2,2-bis(4-phenylene)propane radical, which is derived from bisphenol A and in which Y is isopropylidene and $A^1$ and $A^2$ are each p-phenylene.

The resinous article may consist essentially of polycarbonate. However, it may also contain addition polymers comprising structural units derived from an olefinic nitrile and a conjugated diene. Typical olefinic nitriles are acrylonitrile and methacrylonitrile, the former generally being preferred because of its availability and particular suitability. Suitable dienes include butadiene, isoprene, chloroprene and 1,3-hexadiene, with butadiene being preferred.

The addition copolymer usually also contains structural units derived from an alkenylaromatic compound such as styrene, α-methylstyrene or 4-methylstyrene. Styrene is generally preferred. For the sake of brevity, frequent reference hereinafter will be made to acrylonitrile, styrene and butadiene as the monomers employed. However, it should be understood that other monomers within each genus defined hereinabove may be substituted therefor when appropriate.

Thus, the suitable addition polymers include the ABS resins, which are generally preferred in the present invention.

As previously mentioned, the preferred ABS resins are those prepared by the grafting of styrene and acrylonitrile on a previously formed polybutadiene latex. A possible intermediate in such a method of preparation is a styrene-acrylonitrile copolymer, sometimes hereinafter designated "SAN copolymer". It is also within the scope of the invention, however, to employ as the ABS resin a blend of an SAN copolymer with a previously formed ABS polymer with a relatively high proportion of butadiene units, typically about 40–75% and preferably at least about 50% by weight hereinafter designated "high rubber graft". In any event, the proportions of combined styrene and acrylonitrile in the ABS resin are most often about 60–90% and preferably about 70–80%.

Proportions of acrylonitrile and styrene taken individually are subject to wide variation, depending on the properties desired in the resinous article. Most often, the styrene comprises about 60–90% by weight of the mixture of the two monomers. Unless special conditions are employed, a styrene-acrylonitrile copolymer generally comprises about 75% styrene and about 25% acrylonitrile structural units irrespective of the monomer proportions in the copolymerization mixture, and those are therefore the proportions most often employed.

Polycarbonate generally comprises a major proportion of the polycarbonate-ABS blends employed in the invention, usually about 65–95% by weight and most often about 70–90% thereof. Under these conditions, the polycarbonate is usually the continuous phase in the resin blend with the ABS resin being dispersed therein. No copolymerization between the polycarbonate and the ABS resin is usually observed, but copolymerization is not precluded for the purposes of the invention. The resinous article may contain other materials in addition to the above-described resins. These include flame retardants, initiators, inhibitors, stabilizers, plasticizers, pigments, antistatic agents, impact modifiers, fillers and mold release agents.

Prior to treatment by the method of this invention, it is frequently preferred to clean the surface of the substrate with a degreasing agent, typically a halohydrocarbon such as 1,1,2-trichlorotrifluoroethane, or with a conventional detergent.

The resinous article is then preferably subjected to an adhesion-improving treatment of the type previously mentioned herein. A suitable treatment for polycarbonate articles is the one disclosed and claimed in commonly owned U.S. Pat. No. 5,132,191. The first step thereof is nitration of the surface polymer molecules by treatment with a nitrating agent such as a mixture of nitric acid and sulfuric acid, typically in the range of about 10°–80° C. The second step is ammonolytic cleavage of the nitrated polymer molecules by treatment with an ammonolytic solution, typically aqueous ammonia, usually at a temperature in the range of about 5°–65° C.

Somewhat milder adhesion improving treatments are preferred when the resinous article comprises a mixture of polycarbonate and ABS resin or a similar addition polymer. An example is the method disclosed in commonly owned application Ser. No. 07/822,771 filed on Jan. 21, 1992. It includes a step of contact with an aqueous alkali metal hydroxide solution in which the alkali metal hydroxide concentration is at least about 30% by weight, typically at a temperature in the range of about 30°–90° C., followed by contact with nitric acid, typically in concentrated form, at a temperature in the range of about 10°–50° C.

When the polycarbonate-ABS resin blend comprises up to about 85% by weight polycarbonate, the method of commonly owned U.S. Pat. No. 5,229,169 may be employed. The first step of said method is contact for at least one minute with an aqueous alkali metal hydroxide solution similar to that employed in the above-described method, under similar conditions. The second step is contact with an aqueous alkaline solution of a water-soluble permanganate, preferably sodium or potassium permanganate, typically at a temperature of about 75° C. The last step is contact with a reducing agent such as a hydroxylamine salt to remove any manganese residue.

Except for the employment of two electroless deposition solutions having different phosphorus concentrations, detailed hereinafter, the present invention is directed to a conventional electroless nickel deposition method involving art-recognized, commercially available reagents. Such methods generally begin with a treatment to aid in the absorption of the electroless deposition catalyst, typically with a reagent such as Shipley Cleaner/Conditioner 1175A which is an alkaline solution containing organic compounds. This is followed by treatment with an acidic palladium-containing solution as catalyst, illustrated by Shipley CATAPOSIT ® 44 which comprises tin and palladium compounds, the palladium being the principal catalytic species. Catalyst treatment may be preceded and/or accompanied by surface activation employing, for example, Shipley CATAPREP ® 404 containing sodium bisulfate and various surfactants.

After a water rinse, the substrate may be immersed in a solution of Shipley Accelerator 19, a fluoboric acid-containing formulation used to remove tin, or an equivalent thereof. It may then be further rinsed with water and treated with one or more electroless plating solutions.

Electroless nickel plating solutions are well known in the art and are generally described, for example, in Kirk-Othmer, Encyclopedia of Chemical Technology, Third Edition, Volume 8, the contents of which are incorporated herein by reference. The selection of a particular electroless nickel solution or process is not critical in most respects. The contents of the solution and the plating parameters such as temperature, pH and immersion time will of course depend on the precise nature of the resinous substrate.

The critical feature of the invention is the employment of two electroless nickel plating solutions providing different phosphorus concentrations in the deposited metal. First, a phosphorus-free or low phosphorus (hereinafter sometimes simply "low phosphorus" for brevity) solution is employed which contains phosphorus, if any, in an amount up to 5% by weight. Solutions of this type include those which include such reducing agents as hydrazine.

The preferred solutions under most conditions are those in which the reducing agent is hypophosphite, used under conditions in which relatively small amounts of phosphorus occur in the metal layer as determined, for example, by Auger spectroscopy or inductively coupled plasma analysis. The product literature for electroless nickel solutions routinely provides phosphorus content ranges for the deposited metal under the recommended conditions of use. A typical low phosphorus solution is Enthone ENPLATE® NI-426, which is described in the product literature as producing a coating containing 1-3% phosphorus.

The thickness of the low phosphorus nickel coating should be at least about 0.5 micron. Such thicknesses may be produced by contact with the electroless plating solution for periods on the order of 10-60 minutes at temperatures in the range of 50°-60° C.; those skilled in the art will be able to determine the time and temperature conditions under which to deposit a coating of the required thickness.

Following the deposition of the low phosphorus nickel coating, the solution is further treated with a high phosphorus solution. However, it is within the scope of the invention to interpose between the two nickel coatings the deposition (most often electroless, but electrolytic methods may also be employed) of another metal, typically copper. Copper may be deposited conventionally, using any available electroless copper solution; illustrations are Shipley CUPOSIT® 250 and 251. The thickness of the copper layer, if any, is generally in the range of about 0.8-1.25 microns.

The high phosphorus solution is one which will produce a nickel coating containing phosphorus in the amount of at least 5% and preferably at least 6% by weight. This is typically achieved with a solution employing hypophosphite as a reducing agent and which is used under conditions in which relatively large amounts of phosphorus occur in the metal layer. Typical solutions of this type, together with the phosphorus percentages (by weight) in the deposited nickel coatings according to product literature, are listed in Table I.

TABLE I

| Solution | Phosphorus % |
| --- | --- |
| Enthone ENPLATE ® NI-422 | 10.5–12 |
| Enthone ENPLATE ® NI-424 | 9.0–11.0 |
| Enthone ENPLATE ® NI-425 | 10.5–12 |
| Enthone ENPLATE ® NI-433 | 7.0–8.0 |
| Shipley DURAPOSIT ® 84 | 9.0 |
| Shipley DURAPOSIT ® 90 | 12.0–13.0 |
| Shipley DURAPOSIT ® 92 | 5.0 |

The thickness of the high phosphorus nickel coating deposited in the second step is not critical. All that is necessary is that the total thickness of the nickel layer be adequate for the intended purpose of the article. In general, a high phosphorus layer of at least about 0.5 micron is acceptable.

A further metal coating may be deposited on the substrate after the metal deposition described hereinabove. Deposition of said further coating may be by electroless or electrolytic means, the details of which are likewise known to those skilled in the art.

Another aspect of the invention is a resinous article comprising aromatic polycarbonate and having on its surface a low phosphorus initial electroless nickel coating at least about 0.5 micron thick containing phosphorus, if any, in an amount up to 5% by weight, followed by a high phosphorus electroless nickel coating containing phosphorus in the amount of at least 5% by weight. Such articles are characterized by substantially improved resistance to crack formation and to increases in surface resistivity under severe heat and humidity conditions.

In addition, the electroless nickel layer has excellent adhesion to the resin surface. This is shown by the results of a cross-hatch tape test (hereinafter simply "tape test") adapted from ASTM procedure D3359. In the adaptation, a tool is used to score the metal surface with a series of perpendicular lines to form a grid. A piece of pressure-sensitive tape ("Permacel 610" of 3M Co.) is adhered to the metal surface over the grid and is sharply removed by pulling at approximately 90°. The grid area is then visually inspected for removal of the metal layer and evaluated on a scale of 0–5, with 5 designating essentially no metal removed and 0 designating 65% or more of metal removed.

The invention is illustrated by the following examples. The electroless nickel deposition solutions employed in the examples were Enthone ENPLATE® NI-426 (low phosphorus) and NI-422 (high phosphorus). All percentages are by weight unless otherwise indicated. Each example included a period of exposure in a high temperature/humidity (hereinafter "T/H") chamber at 65° C. and 100% relative humidity.

EXAMPLE 1

A test substrate 2.5×15.2×0.3 cm. in size was molded from a polymer blend consisting of 88.4% bisphenol A polycarbonate having a weight average molecular weight (as determined by gel permeation chromatography) of 24,000, 5.5% SAN copolymer, 6.1% high rubber graft and various conventional additives including 8.9%, based on total resin content, of tetraphenyl resorcinol diphosphate as a flame retardant, said blend containing 8.6% total SAN copolymer and 3.0% butadiene units. The surface of the substrate was cleaned with a commercially available detergent, and the substrate was then immersed for 2 minutes at 75° C. in a 45% aqueous potassium hydroxide solution. It was rinsed with water by immersion for 2 minutes, blow-dried and immersed for about 2 minutes at room temperature in concentrated nitric acid.

The test strip was then coated with an electroless nickel coating by the following scheme of operations:
Water rinse—5 minutes;
Shipley Cleaner-Conditioner 1175A—5 minutes, 75° C.; 2.5% by volume;
Water rinse—2 minutes;
Shipley CATAPREP® 404—1 minute, 270 g/l;
Shipley CATAPOSIT® 44—3 minutes, 44° C., 1.5% by volume, with CATAPREP 404 at 270 g/l, 44° C.;
Water rinse—2 minutes;
Shipley Accelerator 19—3 minutes, 16% by volume;

Water rinse—2 minutes;
ENPLATE® NI-426 solution—30 minutes, 53° C., pH 6.2.
ENPLATE® NI-422 solution—30 minutes, 63° C., pH 4.8 (about 0.5 micron).

After application of the low and high phosphorus electroless nickel layers, the sample passed the tape test with a rating of 5. Its surface resistivity was 0.58 ohms/square. After 4 days of exposure in the T/H chamber, adhesion was still rated at 5 and the surface resistivity had decreased to 0.5 ohms/square, a decrease of 14%.

Two control samples were treated under similar conditions. In control 1, the high phosphorus NI-422 solution was used alone at 60° C. and a pH of 4.8 for 20 minutes. The two sides of the specimen gave tape test results of 5 and 3, respectively. After 1 hour in the T/H cabinet, both sides failed the test.

In control 2, the low phosphorus NI-426 solution was used alone at 53° C. and a pH of 6.2 for 30 minutes. The initial surface resistivity was 1.16 ohms/square. After 3 hours in the T/H chamber, the resistivity increased to 9.06 ohms/square, an increase of 681%.

EXAMPLE 2

As in Example 1, a test substrate was coated with the low phosphorus NI-426 solution. It was then coated with an electroless copper layer having a thickness of about 1 micron, by treatment for 20 minutes at 48° C. with Shipley CUPOSIT® Cu-251 solution. After deposition of the copper coating, it passed the tape test with a rating of 5 and had a surface resistivity of 0.045 ohms/square.

The sample was cut in two pieces and one piece was further nickel plated with high phosphorus NI-422 for 10 minutes at 63° C. and a pH of 4.8. It passed the tape test with an adhesion of 5 and had a surface resistivity of 0.059 ohms/square. After 24 hours in the T/H chamber, the surface resistivity was 0.047 ohms/square (20% decrease).

The other piece, employed as a control, was further plated with low phosphorus NI-426 for 10 minutes. It also passed the tape test and had a surface resistivity of 0.059 ohms/square. However, after 24 hours in the T/H chamber the surface resistivity was 0.094 ohms/square (59% increase).

EXAMPLE 3

A test substrate of the same size as that of Example 1 was molded from a polymer blend consisting of 80.4% bisphenol A polycarbonate having a weight average molecular weight (as determined by gel permeation chromatography) of 24,000, 10.4% SAN copolymer, 9.2% high rubber graft and various conventional additives including 13.3%, based on total resin content, of a commercially available flame retardant additive, said blend containing 15.0% total SAN copolymer and 4.6% butadiene units. The test strip was similarly cleaned and was then immersed for 90 seconds at 75° C. in a 45% (by weight) aqueous potassium hydroxide solution and for 15 minutes at 75° C. in an aqueous solution of "Shipley CIRCUPOSIT® MLB-213", said solution being 1.2N in potassium hydroxide and 0.5N in alkali metal permanganate. After another 2-minute water rinse, manganese residues were removed by immersion in a hydroxylamine salt solution having the designation "Shipley CIRCUIPOSIT® MLB-216" for 5 minutes at 50° C.

The test strip was then coated with an electroless nickel coating by the following scheme of operations:

Water rinse—2 minutes;
Shipley Cleaner-Conditioner 1175A—5 minutes, 75° C.; 2.5% by volume;
Water rinse—2 minutes;
Shipley CATAPREP® 404—1 minute, 270 g/l;
Shipley CATAPOSIT® 44—3 minutes, 44° C., 1.5% by volume, with CATAPREP 404 at 270 g/l, 44° C.;
Water rinse—2 minutes;
Shipley Accelerator 19—3 minutes, 16% by volume;
Water rinse—2 minutes;
ENPLATE® NI-426 solution—55 minutes, 63° C., pH 6.2 (about 4.0 microns).
ENPLATE® NI-422 solution—5 minutes, 63° C., pH 4.8 (about 0.2 micron).

The specimen passed the cross-hatch tape test with an adhesion of 5 and had a surface resistivity of 0.32 ohms/square. After 24 hours in T/H chamber, it still passed the tape test and had a surface resistivity of 0.23 ohms/square (28% decrease). A control sample, plated only with the low phosphorus solution, had a surface resistivity after 24 hours in the T/H chamber of 0.52 ohms/square (63% increase).

EXAMPLE 4

A bisphenol A polycarbonate substrate of the same size of that of Example 1 was similarly cleaned and was nitrated with a mixture of nitric acid and sulfuric acid and then treated with an ammonolytic solution in accordance with the process described in application Ser. No. 07/603,648. It was then subjected to electroless nickel deposition in low phosphorus and high phosphorus solutions in the manner described in Example 1, except that the contact times with the low phosphorus and high phosphorus solutions were 30 minutes and 5 minutes, respectively.

The resulting metallized article had a surface resistivity of 0.23 ohms/square. After 24 hours in the T/H chamber, the surface resistivity was 0.20 ohms/square (13% decrease). A control plated only with NI-426 solution had the same initial surface resistivity, which, however, increased after overnight treatment in the T/H chamber to 0.28 ohms/square (22% increase).

What is claimed is:

1. A method for producing a nickel coating on a resinous article comprising aromatic polycarbonate which comprises initially depositing a first electroless nickel coating which is phosphorus-free or has a phosphorus content up to 5% by weight to a total thickness of at least about 0.5 micron, and subsequently depositing a second electroless nickel coating containing phosphorus in an amount greater than that of said first coating and at least 5% by weight.

2. A method according to claim 1 wherein the resinous article is first subjected to an adhesion-improving treatment.

3. A method according to claim 1 wherein the first nickel coating contains phosphorus.

4. A method according to claim 3 wherein the second nickel coating contains at least 6% phosphorus.

5. A method according to claim 4 wherein the resinous article consists essentially of polycarbonate.

6. A method according to claim 5 wherein the polycarbonate is a bisphenol A polycarbonate.

7. A method according to claim 4 wherein the resinous article also contains an addition polymer comprising structural units derived from an olefinic nitrile and a conjugated diene.

8. A method according to claim 7 wherein the addition polymer is an ABS resin.

9. A method according to claim 8 wherein the resinous article comprises about 65-95% polycarbonate by weight.

10. A method according to claim 9 wherein the polycarbonate is a bisphenol A polycarbonate.

11. A method according to claim 1 wherein electroless deposition of another metal is interposed between the two nickel coatings.

12. A method according to claim 11 wherein the other metal is copper.

* * * * *